US006959315B2

(12) United States Patent
Chren, Jr.

(10) Patent No.: US 6,959,315 B2
(45) Date of Patent: Oct. 25, 2005

(54) SELF-TIMED DIGITAL PROCESSING CIRCUITS

(75) Inventor: William A. Chren, Jr., Longmont, CO (US)

(73) Assignee: STMicroelectronics, Inc., Carrollton, TX (US)

(*) Notice: Subject to any disclaimer, the term of this patent is extended or adjusted under 35 U.S.C. 154(b) by 625 days.

(21) Appl. No.: 10/033,992

(22) Filed: Dec. 27, 2001

(65) Prior Publication Data

US 2003/0126172 A1 Jul. 3, 2003

(51) Int. Cl.[7] ................................................. G06F 7/72
(52) U.S. Cl. ........................................................ 708/491
(58) Field of Search ................................. 708/491, 209

(56) References Cited

U.S. PATENT DOCUMENTS

| 3,691,359 | A | * | 9/1972 | Dell et al. ................... 708/626 |
| 4,827,441 | A | * | 5/1989 | Someshwar et al. ........ 708/209 |
| 5,155,698 | A | * | 10/1992 | Niimi ........................... 708/209 |
| 5,892,632 | A |   | 4/1999 | Behrens et al. |

OTHER PUBLICATIONS

U.S. Appl. No. 09/383,478, filed Aug. 26, 1999.
U.S. Appl. No. 09/656,550, filed Sep. 6, 2000.
Chren, W.A. Jr., "One–Hot Residue Coding for Low Delay–Power Product CMOS Design", IEEE Transactions on Circuits and Systems II: Analog and Digital Signal Processing, v. 45. No. 3, Mar. 1998, pp. 303–313.
Karim Arabi et al., "Oscillation Built–In Self–Test (OBIST) Scheme for Functional and Structural Testing of Analog and Mixed–Signal Integrated Circuits", Proceedings of the IEEE International Test Conference, Washington, D.C., 1997, pp. 786–795.

N. S. Szabo, et al., Residue Arithmetic and its Applications to Computer Technology, McGraw–Hill, 1967, pp. 147–150.
Chren, W.A. Jr., "A New Residue Number System Division Algorithm", Computers and Mathematics with Applications, vol. 19, No. 7, 1990, pp. 13–29, 1990.
Gago, A. et al. "Reduced implementation of D–Type DET Flip–Flops", IEEE Journal of Solid–State Circuits, vol. 28, No. 3, Mar. 1993, pp. 400–402.
Farrahi, A. et al., "Activity–Driven Clock Design", IEEE Transactions on Computer–Aided Design of Integrated Circuits and Systems, vol. 20, No. 6, Jun. 2001, pp. 705–714.
Rabaey, J.M. "Digital Integrated Circuits: A Design Perspective", Prentice Hall, 1996, pp. 528–530.

* cited by examiner

Primary Examiner—D. H. Malzahn
(74) Attorney, Agent, or Firm—Stephen C. Bongini; Lisa K. Jorgenson

(57) ABSTRACT

A self-timed data processing circuit module is provided. Data is provided to the data processing circuit along with a Req handshaking input. The data processing circuit has an isochronous processing delay for all data inputs. An example of a data processing circuit with isochronous processing delay is a One Hot Residue Number System arithmetic processing circuit. The data processing circuit processes the input data while the Req input propagates through a delay circuit that has substantially the same processing delay as the data processing circuit. Thus, the propagation delay of the Req signal is substantially equal to the data processing circuit's processing time. This allows the output of the delay circuit to be used to both latch the output of the data processing circuit and provide a "data ready" output.

20 Claims, 5 Drawing Sheets

SELF-TIMED DIGITAL PROCESSING CIRCUITS

BACKGROUND OF THE INVENTION

1. Field of the Invention

The present invention relates to electronic circuits, and more specifically to self-timed circuits that are used as data processing modules.

2. Description of Related Art

Power consumption is now a very important consideration in integrated circuit design. This has compelled circuit designers to consider reducing power consumption through changes in many different levels of the design process, such as the system, technology, algorithm, physical, and circuit levels. For example, system level approaches for reducing power consumption include power supply voltage scaling, clock gating, and subsystem sleep (or power down) modes. Technology level techniques include using dynamic threshold MOSFETs, and algorithm level techniques include using alternate number systems and state encoding. Further, physical level methods include transistor reordering, and circuit level methods include self-timed asynchronous approaches and glitch reduction. The ultra-low power circuits of the future will have to employ several of these approaches because none alone can achieve the power reduction goals for the next decade.

While all of the techniques described above advantageously reduce power consumption, many of them have a deleterious side effect of reducing the speed of the circuit. For example, supply voltage scaling lengthens the system clock period if other factors such as technology and drive strength are kept the same. For this reason, designers now consider the delay-power (DP) product of a circuit as the crucial factor in low power circuit design. One system level design approach that is currently being investigated due to of its potential for significantly reducing the DP product is the One-Hot Residue Number System (OHRNS). For example, the OHRNS is being considered for use in the adaptive FIR (finite impulse response) filters and Viterbi detectors of hard disk drive read channels, in the endecs of wireless telecommunication integrated circuits, and in the adaptive filters of image processing integrated circuits.

The Residue Number System (RNS) is an integer number system in which the basic operations of addition, subtraction, and multiplication can be performed quickly because there are no carries, borrows, or partial products. This allows the basic operations to be performed in a single combinational step, digit-on-digit, using simple arithmetic units operating in parallel. However, other operations such as magnitude comparison, scaling (the RNS equivalent of right shifting), base extension (the RNS equivalent of increasing the bit width), and division are slower and more complicated to implement. Thus, RNS is most widely used in applications in which the basic operations predominate, such as digital signal processing.

The RNS representation of an integer X is a number of digits, with each digit being the residue of X modulo a specially chosen integer modulus. In other words, X is represented as the vector of its residues modulo a fixed set of integer moduli. In order to make the RNS representation of each integer unique for all non-negative values less than the product M of the moduli, the moduli are chosen to be pairwise relatively prime (i.e., the smallest single number into which all divide evenly is equal to the product of the moduli). Letting $m_i$ denote the $i^{th}$ modulus, the RNS representation of X is given by $X \Leftrightarrow (x_1, x_2, \ldots, x_n)$, where $x_j = X$ modulo $m_i$ and is known as the $i^{th}$ residue digit of the RNS representation of X. Table 1 shows the representation of the integers 0 to 2430 in an RNS in which $m_1=11$, $m_2=13$, and $m_3=17$ ("an 11, 13, 17 RNS representation").

TABLE 1

| Integer X | RNS digit $x_{11}$ | RNS digit $x_{13}$ | RNS digit $x_{17}$ |
|---|---|---|---|
| 2430 | 10 | 12 | 16 |
| 2429 | 9 | 11 | 15 |
| ... | | | |
| 19 | 8 | 6 | 2 |
| 18 | 7 | 5 | 1 |
| 17 | 6 | 4 | 0 |
| 16 | 5 | 3 | 16 |
| 15 | 4 | 2 | 15 |
| 14 | 3 | 1 | 14 |
| 13 | 2 | 0 | 13 |
| 12 | 1 | 12 | 12 |
| 11 | 0 | 11 | 11 |
| 10 | 10 | 10 | 10 |
| 9 | 9 | 9 | 9 |
| 8 | 8 | 8 | 8 |
| 7 | 7 | 7 | 7 |
| 6 | 6 | 6 | 6 |
| 5 | 5 | 5 | 5 |
| 4 | 4 | 4 | 4 |
| 3 | 3 | 3 | 3 |
| 2 | 2 | 2 | 2 |
| 1 | 1 | 1 | 1 |
| 0 | 0 | 0 | 0 |

As an example, for the natural number 19, the $x_{11}$ digit is 19 mod(11)=8 (i.e., 19÷13=1 remainder 8), the $x_{13}$ digit is 19 mod(13)=6, and the $x_{17}$ digit is 19 mod(17)=2. Each RNS digit is determined without reference to any other RNS digit, and no RNS representation repeats in the range from 0 to 2430. Negative integers can be represented by limiting the represented range to an equal (or substantially equal) number of positive and negative numbers. The representation of the range from −1215 to 1215 in the 11, 13, 17 RNS representation is shown in Table 2. No separate sign is associated with the RNS representation, and the sign of the represented integer cannot be determined from any less than all of its RNS digits.

TABLE 2

| Integer X | RNS digit $x_{11}$ | RNS digit $x_{13}$ | RNS digit $x_{17}$ |
|---|---|---|---|
| 1215 | 5 | 6 | 8 |
| 1214 | 4 | 5 | 7 |
| ... | | | |
| 4 | 4 | 4 | 4 |
| 3 | 3 | 3 | 3 |
| 2 | 2 | 2 | 2 |
| 1 | 1 | 1 | 1 |
| 0 | 0 | 0 | 0 |
| −1 | 10 | 12 | 16 |
| −2 | 9 | 11 | 15 |
| −3 | 8 | 10 | 14 |
| −4 | 7 | 9 | 13 |
| ... | | | |
| −1214 | 7 | 8 | 10 |
| −1215 | 6 | 7 | 9 |

In the RNS, the basic operations of addition, subtraction, and multiplication are performed in digit-parallel fashion, modulo $m_i$. Thus, if operands X and Y have RNS representations of $X \Leftrightarrow (x_1, x_2, \ldots, x_n)$ and $Y \Leftrightarrow (y_1, y_2, \ldots, y_n)$, the result Z has an RNS representation of $Z \Leftrightarrow (x_1 \circ y_1,$ $x_2°y_2, \ldots, x_n°y_n$), where "$x_i°y_i$" represents any of the basic operations performed on the two RNS digits modulo $m_i$. More specifically, the corresponding RNS digits of the two numbers are added, subtracted, or multiplied, and then the proper modulo operation is performed on each to produce the RNS digits of the result.

For example, in the 11, 13, 17 RNS representation of Table 1, 4+15 gives (4, 4, 4)+(4, 2, 15) or (4+4 mod(11), 4+2 mod(13), 4+15 mod(17)), which equals (8,6,2) or 19. Similarly, 19−15 gives(8−4 mod(11), 6−2 mod(13), 2−15 mod(17)), which equals (4, 4, 4) or 4. Further, 6×3 gives (6×3 mod(11), 6×3 mod(13), 6×3 mod(17)), which equals (7, 5, 1) or 18. Because all individual operations are performed on each RNS digit independently and without reference to any other RNS digit, the operations can be performed completely in parallel. Thus, each of the basic operations can be performed quickly and efficiently, especially when all of the moduli are relatively small integers.

In typical implementations, addition is the fundamental RNS operation and subtraction is performed by adding the additive inverse of the subtrahend. Multiplication is also performed using addition by using the following properties. Any prime modulus p has at least one primitive root, which is an integer $\alpha$ of order p-1 under multiplication. In other words, the primitive root is an integer $\alpha$ whose successive powers, taken modulo p, are the nonzero integers modulo p (i.e., for any $0 \leq X < p$, $X = \alpha^k$ modulo p for some $0 \leq k \leq p-2$). In such a case, X is said to have an index of k, modulo p.

Given the primitive root, multiplication modulo p can be performed by adding the indices modulo p-1. This is analogous to using logarithms in the binary number system. For example, $\alpha=2$ is a primitive root modulo 13 because, the integers $2^0$, $2^1$, $2^2$, $2^3$, $2^4$, $2^5$, $2^6$, $2^7$, $2^8$, $2^9$, $2^{10}$, and $2^{11}$ modulo 13 are equal to 1, 2, 4, 8, 3, 6, 12, 11, 9, 5, 10 and 7, respectively. Thus, if X=5 ($2^9$ modulo 13) and Y=7 ($2^{11}$ modulo 13), X×Y=35 ($2^8$ modulo 13). Thus, the index of the product modulo p (8) of two RNS digits can be determined by adding the indices of the two RNS digits (9 and 11), modulo p-1 (i.e., (9+11) mod(12)=8).

In electronic circuit implementations, the RNS digits can be encoded in various ways. In conventional binary encoding, each RNS digit is converted to a binary number that is represented by the states of one or more lines, each of which is in one of two states to represent a binary digit of "0" or "1". There is also the "one-hot" encoding scheme in which each possible value of an RNS digit is associated with a separate two-state line. For example, in the 11, 13, 17 RNS representation, 11 lines are used to represent the first RNS digit, 13 lines are used to represent the second RNS digit, and 17 lines are used to represent the third RNS digit. When an RNS digit has a given value, the line associated with that value is high and all of the other lines are low. Thus, only one line of a digit is high (or hot) at any given time.

The use of the one-hot encoding scheme with the RNS produces such compelling advantages in electronic circuit implementations that such a system is identified as the "One-Hot Residue Number System" (OHRNS). While the OHRNS is really the same RNS with the same arithmetic properties, the advantages of using one-hot encoding include basic operation implementation using barrel shifters with their superior delay-power products and operand-independent delays, simple and regular layout of arithmetic circuits, and zero-cost implementation through signal transposition of inverse calculation, index calculation, and residue conversion. When any RNS digit changes in value, at most two lines change state. This is the minimal possible activity factor and yields low power dissipation. Because in OHRNS implementations signal activity factors are near minimal and fewer critical path transistors are present, such systems have very low delay-power products. (A detailed explanation of OHRNS circuits can be found in W. A. Chren, Jr., "One-Hot Residue Coding for Low Delay-Power Product CMOS Design," IEEE Transactions on Circuits and Systems II: Analog and Digital Signal Processing, v. 45, no. 3 (March 1998), pp. 303–313, which is herein incorporated by reference.)

With one-hot encoding of the RNS digits, addition can be performed through a cyclic shift (i.e., rotation). In particular, one of the operands is rotated by an amount equal to the value of the other operand. While such a rotation can be implemented using several different types of circuits, barrel shifters allow all possible rotations of the first operand to be computed in parallel. The second operand determines which of the rotations is output from the barrel shifter as the result. A conventional OHRNS modulo $m_i$ adder is shown in FIG. 1(a). The adder 10 includes a modulo $m_i$ barrel shifter 12 that performs the addition, and a static pipeline register 14 that stores the result for downstream processing. FIG. 1(b) shows the internal structure of the barrel shifter. As shown, NMOS pass transistors 16 are used instead of transmission gates to yield higher speed and lower power dissipation due to smaller input and output capacitive loadings (i.e., because there are half as many NMOS sources/drains per input/output line as when transmission gates are used).

Further, in the OHRNS, subtraction can be performed by adding the additive inverse of the subtrahend, and the additive inverse can be computed by a simple one-to-one mapping using signal transposition. FIG. 2 shows a conventional OHRNS modulo $m_i$ subtractor. As shown, the subtractor 20 is identical to the adder 10 of FIG. 1(a) except for the use of signal transposition 22 on the subtrahend input to the barrel shifter 12. The signal transposition 22 computes the additive inverse quickly and simply through a one-to-one mapping of inputs to outputs.

Multiplication in the OHRNS can also be performed with barrel shifters by using indices. Indices and their additive inverses, which are known as anti-indices, are the RNS equivalents of logarithms and antilogarithms, as explained above. The computation of indices and anti-indices in any modulus can be performed quickly and simply through a one-to-one mapping. In particular, such mappings in the OHRNS are implemented by merely permutating the signal lines of the RNS digit. In other words, indices and anti-indices can be computed through signal transpositions or wire permutations that require no active circuitry and introduce little or no delay.

FIG. 3 shows a conventional OHRNS modulo $m_i$ multiplier that uses wire transpositions to compute indices and anti-indices. More specifically, the multiplier 30 uses signal transpositions 34, 36, and 38 on the input and output lines to compute the indices and anti-indices, and a barrel shifter 32 to add the indices. A small amount of combinational logic 39 is provided to handle the special case in which at least one of the operands is zero. The separate handling of this special case allows the barrel shifter 32 to perform addition modulo $m_i-1$, rather than modulo $m_i$. As in the adder 10 of FIG. 1(a), a static pipeline register 14 stores the resulting product for downstream processing.

Conventional OHRNS circuit designs assemble multiple circuits onto an integrated circuit and these circuits are used in a pipelined architecture with chip-wide clocking for high speed and throughput. These designs typically utilize a single system clock signal (or multiple phased versions of a single clock signal) that is distributed to all circuitry on the chip. Proper operand flows and timing are enforced throughout the chip by pipeline latches driven by this clock signal. These designs have a clock distribution net on the chip that consumes large amounts of power (as much as 15% to 45% of the power consumed by the chip). This is because the clock distribution net is large, has high parasitic capacitance and, in many cases, runs at the full clock frequency. Additional power is consumed in these designs by clocking all pipeline latches every clock period, even though the latch is not required to be clocked if its outputs do not change.

The design of an integrated circuit with a clock distribution net requires extensive care in the laying out the clock net. This design requirement is especially burdensome for large circuits. The clock signal must be delivered to every pipeline stage and the design must maintain the timing integrity of the clock signal, which often operates at the full speed of the circuit. The design of the clock distribution net must also ensure proper sizing of each segment according to the load on that segment because highly loaded segments propagate the clock signal more slowly than segments with smaller loads.

An alternative to synchronous designs is the utilization of self-timed, or asynchronous, circuit modules. A conventional asynchronous system design 400 is illustrated in FIG. 4. This example asynchronous circuit uses multiple circuit modules, or subsystems, which each accept data signals and a Req input. The example system 400 includes multiple subsystems, subsystem A 450a, subsystem B 450b and subsystem N 450c. These multiple subsystems have similar interfaces. As an example, the first subsystem, subsystem A 450a, of the system 400 has an m line data input 402, an m line data output 406, a Req input 404 and an Ack output 408 ("data output ready"). The circuit subsystem toggles the Ack output 408 when the data signal outputs 406 are stable and ready to be accepted for processing by the following subsystem.

The subsystems of this asynchronous system 400 each operate upon transitions of their Req input, such as the Req input 404 of subsystem A 450a. The receiving subsystem (e.g., subsystem B 450b) is notified that the data signal (e.g., data output 406 of subsystem A 450a) is ready by receiving the Ack output of the previous subsystem on its Req line (e.g., the Req input 413 of subsystem B 450b). When the subsystem that has received a data input has completed its processing, the subsystem (e.g., subsystem B 450b) indicates that its data output is stable (latched) and ready for receipt by a following circuit by toggling its Ack output line (e.g., second Ack output 414 of subsystem B 450b). This toggling of the Ack line is also an indication that the subsystem is ready to accept its next data input.

Control of the data flow between subsystems in the system 400 is regulated by control units 410. Each control unit 410 toggles the Req input signal 413 for a subsystem 450b when the preceding subsystem 450a toggles its Ack output signal 408 and the following subsystem (not shown) has its Req input signal toggled (signal 412). This operation results in the toggling of a Req input of a subsystem only when both the upstream Ack and the downstream Req signals are toggled. This ensures that a subsystem does not begin processing input data until: 1) it has finished processing a prior input, 2) the following subsystem is ready to accept that output, and 3) the following subsystem has produced a data output that is ready to be accepted.

The control units 410 used in the example system 400 use Muller C-elements. Muller C-elements can be thought of as AND gates that react to signal transitions. A truth table for a Muller C-element, with two inputs A and B and one output OUT is shown in Table 3.

TABLE 3

| A | B | OUT |
|---|---|-----|
| 0 | 0 | 0 |
| 0 | 1 | $Out_{i-1}$ |
| 1 | 0 | $Out_{i-1}$ |
| 1 | 1 | 1 |

The subsystems of the example asynchronous system 400 latch the output data when the Ack output is generated. The circuit designs of subsystems used in conventional asynchronous systems require significant hardware and power to generate the Ack output signal. The processing that generates the Ack signal within these subsystems also adds to the processing delay of the subsystems.

SUMMARY OF THE INVENTION

It is an object of the present invention to provide improved arithmetic circuits for use with the Residue Number System (RNS).

Another object of the present invention is to provide arithmetic circuits that exhibit lower power dissipation and higher speed than conventional circuits.

It is yet another object of the present invention to provide asynchronous circuit modules that facilitate incorporation into larger circuit designs.

Still another object of the present invention is to provide improved asynchronous RNS arithmetic circuit modules that do not require a component wide or chip wide clock distribution net.

One preferred embodiment of the present invention provides a digital signal processing circuit module that includes an isochronous data processing circuit having at least two inputs and a data output, a delay circuit, and an output latch. The isochronous circuit has a uniform processing delay to determine the data output for all valid input combinations, and the delay circuit produces a delayed control signal by delaying a control signal by a time period that is substantially equal to the uniform processing delay of the data processing circuit. The output latch latches the data output of the data processing circuit based on the delayed control signal produced by the delay circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1A:
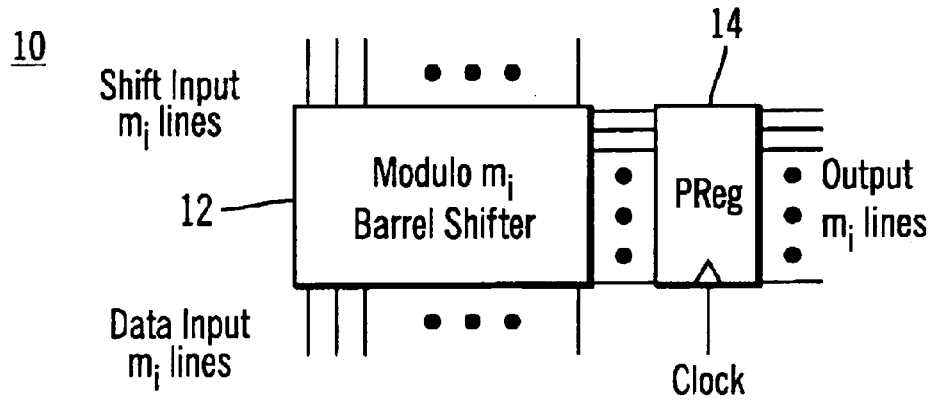
FIG. 1(a) is a block diagram showing a conventional OHRNS modulo $m_i$ adder.
Figure 1B:
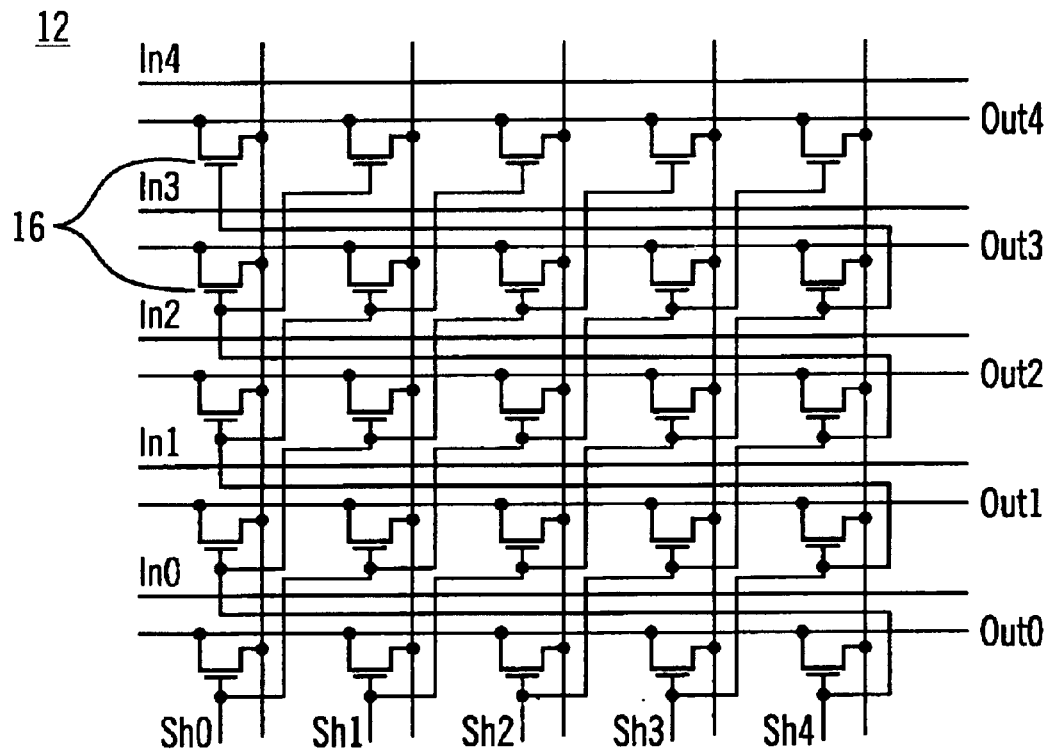
FIG. 1(b) is a circuit diagram showing a barrel shifter for $m_i=5$.
Figure 2:
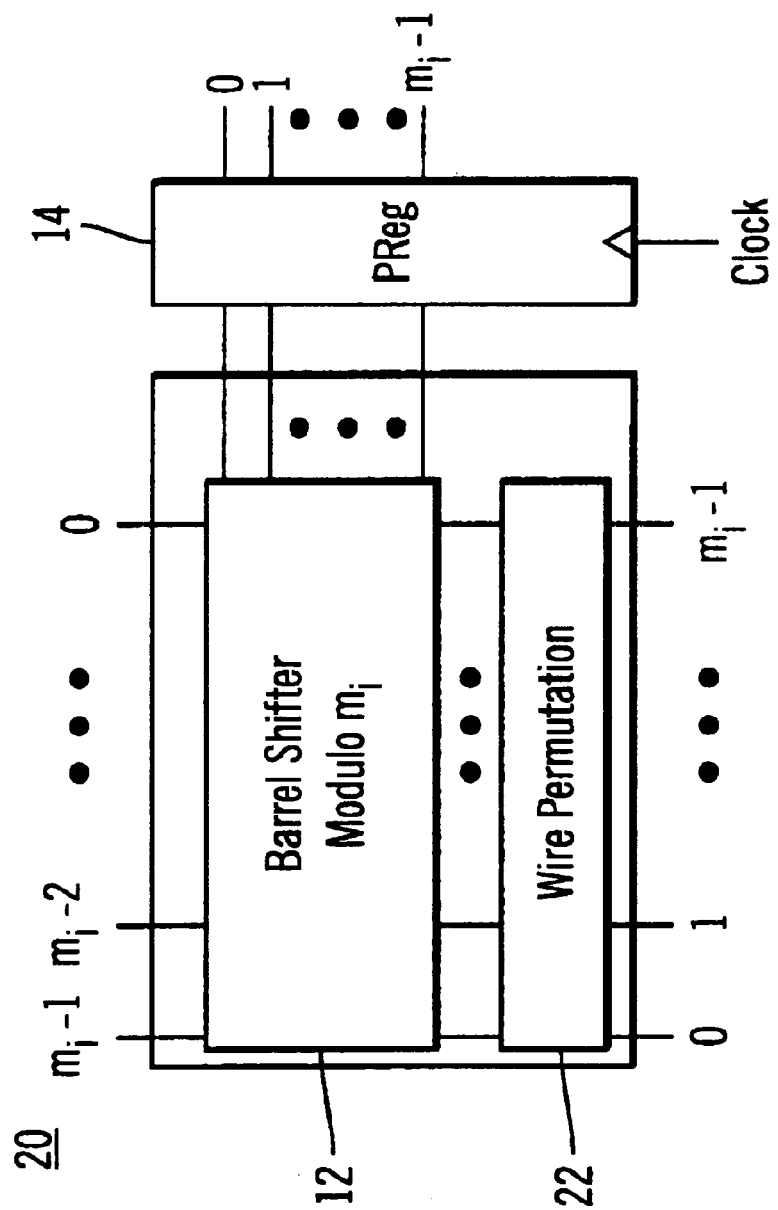
FIG. 2 is a block diagram showing a conventional OHRNS modulo $m_i$ subtractor.
Figure 3:
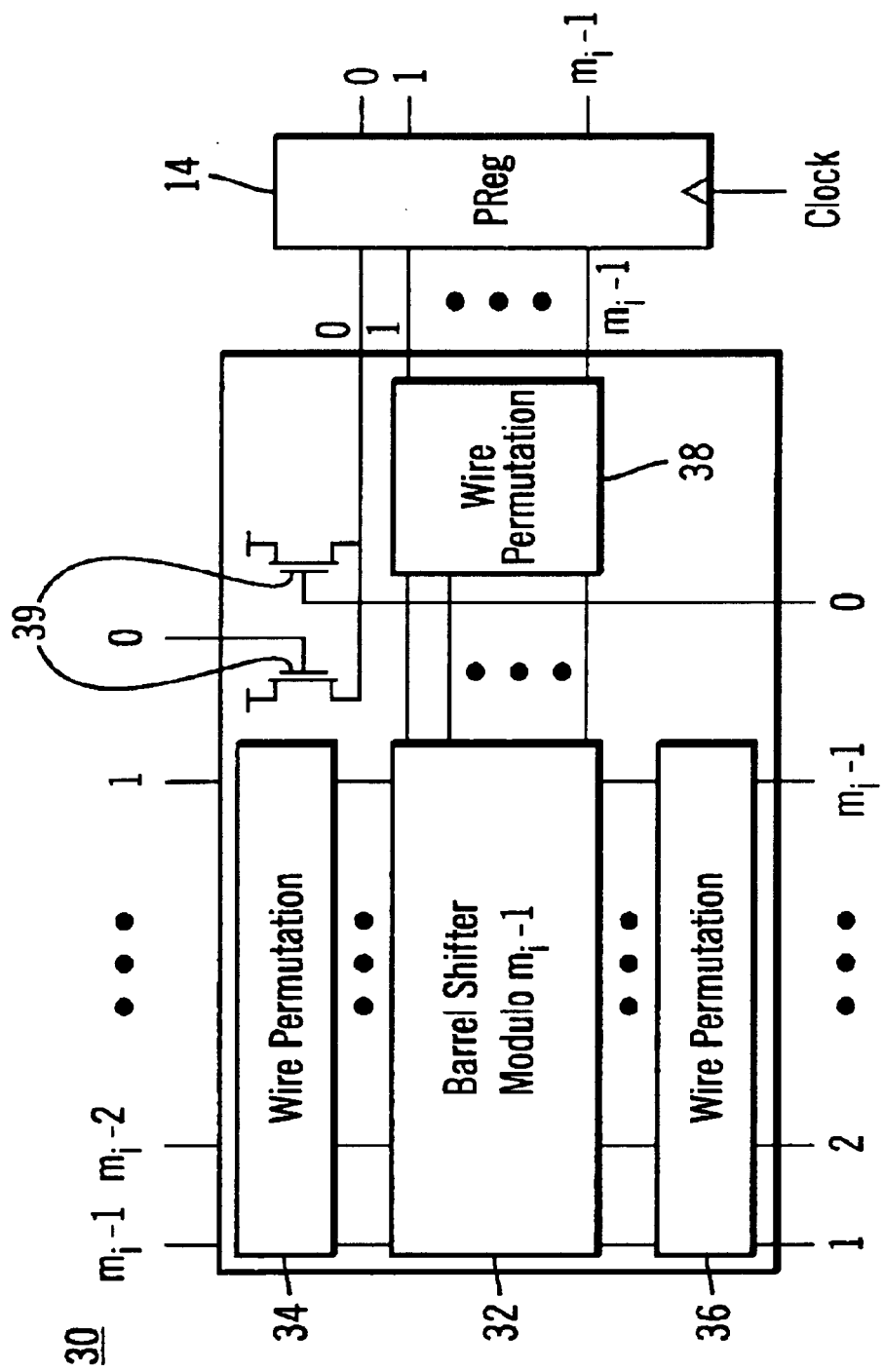
FIG. 3 is a block diagram showing a conventional OHRNS modulo $m_i$ multiplier.

The core circuits used to perform OHRNS arithmetic operations have the advantageous property that the processing time required for a processing circuit to determine an output value for a changed input is identical for all values of inputs. Such circuits that have a processing delay that is not a function of input data values are referred to as isochronous circuits. The OHRNS arithmetic circuits exhibit this property because each input, as is illustrated in FIG. 1(b), drives an equal number of transistor terminals and each output is driven by an equal number of transistor terminals. This results in equal loading of each input and output, and any combination of valid OHRNS inputs results in similar transistor state changes (e.g., in the open drain OHRNS circuit illustrated in FIG. 1(b), all transistors conduct except the one corresponding to the logic high output).

The present invention takes advantage of this property of OHRNS arithmetic circuits to provide a properly timed Ack output to synchronize the data output of core OHRNS arithmetic circuits. The Ack output is generated in the preferred embodiments through the use of a low power and low part count circuit that exploits the isochronous nature of the core arithmetic circuits.

Figure 5:
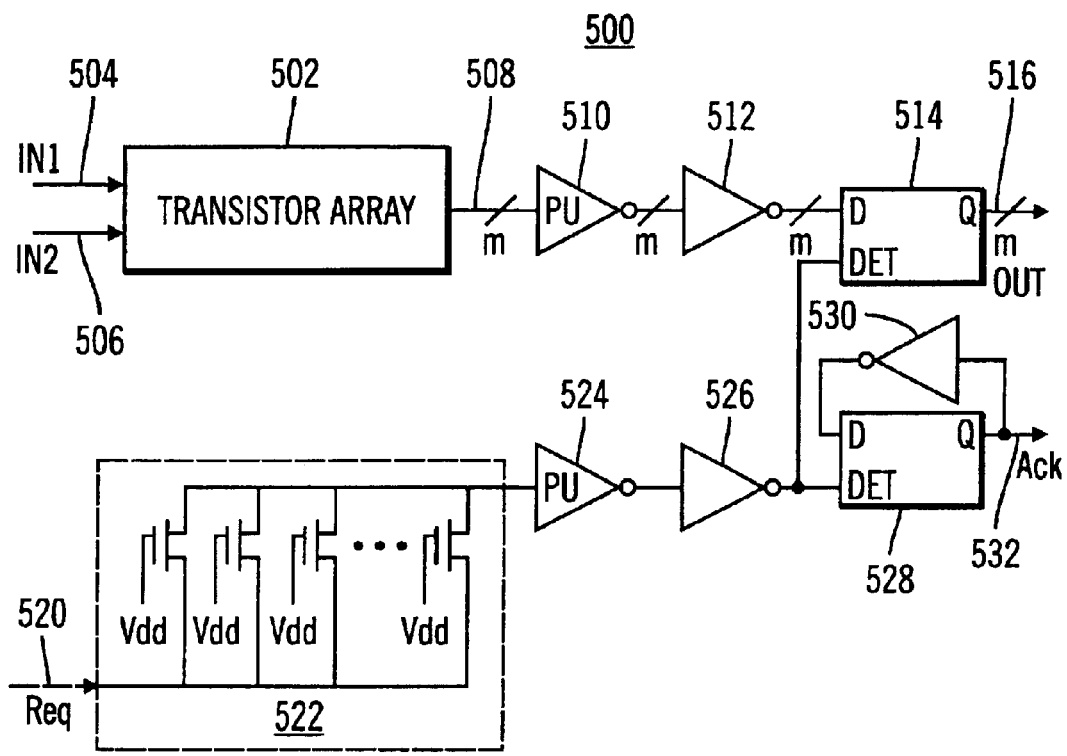
FIG. 5 is a block diagram showing a processing subsystem according to one embodiment of the present invention.

A self-timed modulo m two-input arithmetic module 500 according to one embodiment of the present invention is illustrated in FIG. 5. The modulo m two-input arithmetic circuit of this embodiment includes an isochronous circuit that is an OHRNS arithmetic processing transistor array 502 that performs an isochronous operation upon the two data inputs, IN1 504 and IN2 506. The OHRNS arithmetic processing transistor array 502 is preferably the core of an OHRNS arithmetic circuit such as an adder, subtractor, or multiplier (such as those described above). However, further embodiments incorporate data processing transistor arrays 502 that accept different numbers of inputs, including one input, three inputs, or more. The illustrated OHRNS arithmetic processing transistor array 502 accepts two input data sets, which are each conveyed on m data lines, and produces an m data line output 508.

An example of such a transistor array 502 is illustrated in FIG. 1(b). The example transistor array contains a number of open drain transistors that are in parallel with the inputs and outputs of the transistor array. The number of transistors that are in parallel with the inputs and outputs along with the characteristics of the transistors themselves determine the processing delay through the transistor array 502. Alternative embodiments of the present invention utilize other isochronous processing circuits in place of the transistor array 502. Such isochronous circuits are implemented with designs that result in a processing delay of the circuit that is not a function of input data values (i.e., the processing time required to determine the output is identical for all values of inputs).

The output of the transistor array 502 is fed into a pull-up buffer 510. Pull-up buffer 510 incorporates a pull up resistor (to Vdd) for each data input line in order to provide power to the open drain outputs of the transistor array 502. These m data lines are then actively buffered by buffer amplifiers within the pull-up buffer 510. The m line outputs of the pull-up buffer 510 are then further buffered by an m line buffer 512. (Alternative embodiments do not use this double buffering architecture, and may have one buffer or simply use a storage element such as a latch flip flop at the output of the transistor array.) As shown, the m output lines of the m line buffer 512 are provided as data inputs to an m line double-edge-triggered (DET) D flip-flop 514. The m line DET D flip-flop 514 is triggered by the Ack output of the module, the generation of which is described below. Once triggered, the m line output 516 of the m line DET D flip-flop 514 maintains the latched output data at the output OUT of the module 500.

The illustrated module 500 also accepts a Req input 520. The Req input 520 is delayed by being passed through a transistor delay block 522. The transistor delay block of this embodiment contains an equal number of transistors in series with its one input and one output as the transistor array 502 has with each of its inputs and outputs. This results in a signal propagation delay through the transistor delay bock 522 that is equal (or substantially equal) to the delay through the transistor array 502. In preferred embodiments, the transistor delay block 522 is fabricated on an integrated circuit that also contains the transistor array 502. Preferred embodiments further locate the transistor array 502 and transistor delay block 522 in close proximity to one another so as to maximize the similarity of transmission characteristics through the two processing blocks. Thus, the illustrated embodiment takes advantage of the isochronous property of the transistor array 502 by using a similarly designed isochronous delay block 522 to match the propagation delay through the transistor array 502.

The processing circuitry that follows the transistor delay block 522 is also similar to the circuitry that follows the transistor array 502. Preferred embodiments also fabricate these circuit components on the same integrated circuit so as to maximize the similarity of the transmission characteristics of the two circuit branches. As shown, the single output line of the transistor delay block 522 is processed by a similar pull-up buffer, Req pull up buffer 524, but the Req pull-up buffer 524 has only one signal line. The output of the Req pull-up buffer 524 is processed by a Req buffer 526 having similar circuitry, and therefore similar delay characteristics, as the m line buffer 512.

The output of the Req buffer 526 drives the Double Edge Trigger (DET) input of an Ack DET D flip-flop 528 as well as the DET input of the m line DET D flip flop 514. The output of the Ack DET D flip-flop is the Ack output 532. Ack output 532 drives the input of an inverting buffer 530. The output of the inverting buffer 530 drives the data input of the Ack DET D flip-flop 528. Inverter 530 is used to cause the Ack output 532 to toggle between states upon toggling of the DET input of the Ack DET D flip-flop 528. This toggling is required in order to implement the proper operation of the Ack output, as is described above.

The illustrated embodiment utilizes the m line buffer 512 to drive only the data input of the m line DET D flip-flop 514, a structure that has each output line driving a single input. On the other hand, the Ack buffer 526 drives two DET inputs, the DET input of the m line DET D flip-flop 514 and the DET input of the Ack DET D flip-flop 528. The additional loading of the Ack buffer 526 output results in a slightly longer propagation delay from the output of the Ack buffer 526 than is exhibited by the m line buffer 512.

However, this additional propagation delay advantageously provides a small set up time for the circuits within the m line DET D flip-flop 514 prior to assertion of the DET input of the m line DET D flip flop 512.

Figure 6:
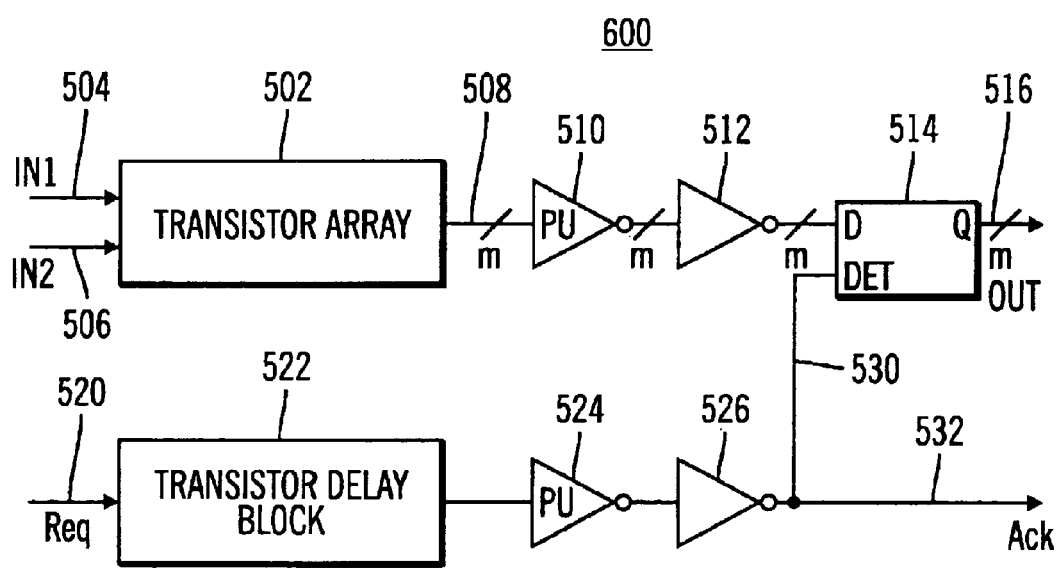
FIG. 6 is a block diagram showing a processing subsystem according to another embodiment of the present invention.

A second embodiment of the present invention, as shown by the self-timed modulo m two-input arithmetic module 600 in FIG. 6, is similar to the embodiment of FIG. 5, but utilizes the output of the Ack buffer 526 as the Ack output 532, thus eliminating the Ack DET D flip-flop 528 and inverter 530. Utilizing the output of the Ack buffer 532 as the Ack output 532 results in removal of one DET D flip-flop, the Ack DET D flip-flop 528, from the module.

Figure 4:
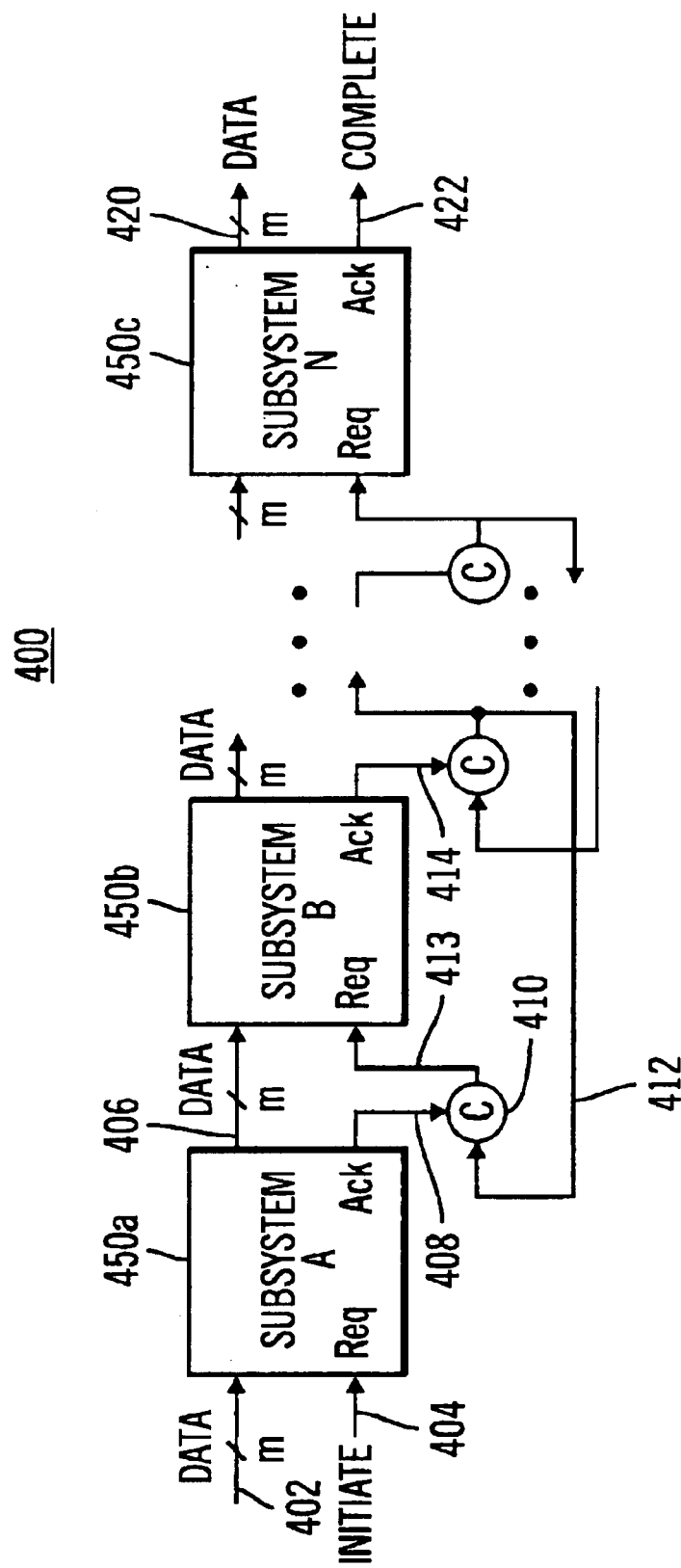
FIG. 4 is a block diagram showing an asynchronous system.

The self-timed modules illustrated above in FIGS. 5 and 6 can be used as subsystem modules that are integrated into a complete system such as the asynchronous system 400 of FIG. 4. Such asynchronous systems that contain multiple self-timed modules preferably utilize control units, such as control units 410 or the like, to ensure proper timing of data transfers between the various self-timed modules. For example, the self-timed arithmetic modules of FIGS. 5 and/or 6 can be integrated in the asynchronous system of FIG. 4 as one or more of the subsystems 450 of the system.

Accordingly, embodiments of the present invention provide self-timed circuit modules that include an efficient signal timing structure to produce a properly timed "data output ready" output (i.e., Ack output) of the self-timed circuit module. The signal timing structure delays the Req input by processing the Req input signal with a circuit that has an electrical path that is similar to the electrical path through which the input data travels. The OHRNS data processing circuits utilized in preferred embodiments exhibit a similar electrical path for all input data values, and this characteristic is exploited by incorporating a delay circuit that provides an electrical path for the Req input timing signal that is similar to the electrical path through which the input data travels. Preferred embodiments further incorporate this delay circuit on the same semiconductor substrate to provide a better match between the data processing circuit and the delay circuit. Thus, the present invention provides asynchronous circuit modules that provide self-timing signals with reduced power consumption and circuit area.

The embodiments of the present invention described above relate to specific CMOS circuit implementations and the use of "one-hot" encoding. However, the arithmetic circuits of the present invention could also be implemented using other integrated circuit technologies and other encoding schemes (e.g., a "one-cold" encoding scheme). Similarly, signal transposition may be achieved in various manners (e.g., through a simple renaming of the lines). Additionally, other design choices, such as the number and values of moduli in the RNS and the physical size and layout of the circuit elements could easily be adapted by one of ordinary skill in the art. Furthermore, embodiments of the present invention may not include all of the features described above. For example, pass transistor-based barrel shifters and signal level restoration may not be included in all embodiments.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A digital signal processing circuit module comprising:
    an isochronous data processing circuit having at least two inputs and a data output, the isochronous circuit having a uniform processing delay to determine the data output for all valid input combinations;
    a delay circuit receiving a control signal and producing a delayed control signal, the delayed control signal being produced by delaying the control signal by a time period that is substantially equal to the uniform processing delay of the data processing circuit; and
    an output latch coupled to the data processing circuit and the delay circuit, the output latch latching the data output of the data processing circuit based on the delayed control signal produced by the delay circuit.

2. The digital signal processing circuit module as defined in claim 1, wherein the isochronous circuit and the delay circuit are fabricated on a single semiconductor substrate.

3. The digital signal processing circuit module as defined in claim 1,
    wherein the data processing circuit includes a transistor array having two multiple line data inputs and one multiple line data output,
    the delay circuit includes a transistor block having one input and one output;
    the transistor array of the data processing circuit has a first number of transistors in parallel with each line of the data inputs and a second number of transistors in parallel with each line of the data output, and
    the delay circuit has the first number of transistors in parallel with the input of the delay circuit and the second number of transistors in parallel with the output of the delay circuit.

4. The digital signal processing circuit module as defined in claim 1, wherein the delayed control signal produced by the delay circuit has additional output loading so as to provide an additional delay.

5. The digital signal processing circuit module as defined in claim 1, wherein the data processing circuit is one of an OHRNS adder, an OHRNS subtractor, and an OHRNS multiplier.

6. A OHRNS arithmetic processing module comprising:
    an OHRNS arithmetic processing transistor array having at least one multiple line data input and at least one multiple line data output;
    a delay circuit receiving a control signal at input and producing a delayed control signal at output, the delay circuit having an equal number of transistors in parallel with the input of the delay circuit as are in parallel with one of the lines of the multiple line data input of the OHRNS arithmetic processing transistor array, the delay circuit also having an equal number of transistors in parallel with the output of the delay circuit as are in parallel with one of the lines of the multiple line data output of the OHRNS arithmetic processing transistor array; and
    an output latch coupled to the OHRNS arithmetic processing transistor array and the delay circuit, the output latch latching the multiple line data output of the OHRNS arithmetic processing transistor array based on the delayed control signal produced by the delay circuit.

7. The OHRNS arithmetic processing module as defined in claim 6, wherein the OHRNS arithmetic processing transistor array and the delay circuit are fabricated on a single semiconductor substrate.

8. The OHRNS arithmetic processing module as defined in claim 6, wherein the output of the delay circuit has additional output loading so as to cause an additional delay.

9. The OHRNS arithmetic processing module as defined in claim 6, wherein the OHRNS arithmetic processing transistor array is a core of one of an OHRNS adder, an OHRNS subtractor, and an OHRNS multiplier.

10. An asynchronous system comprising:
a plurality of digital signal processing circuit modules, each of the digital signal processing circuit modules having at least one data input, at least one data output, a control input, and a control output; and
a plurality of control units, each of the control units being coupled to the control output of one of the digital signal processing circuit modules,
wherein at least one of the digital signal processing circuit modules includes:
an isochronous data processing circuit coupled to the data input of the digital signal processing circuit module, the isochronous circuit having a uniform processing delay to determine the data output for all valid data inputs;
a delay circuit coupled to the control input of the digital signal processing circuit module, the delay circuit producing a delayed control signal by delaying by a time period that is substantially equal to the uniform processing delay of the data processing circuit; and
an output latch coupled to an output of the data processing circuit and to the delay circuit, the output latch latching the output of the data processing circuit based on the delayed control signal produced by the delay circuit.

11. The asynchronous system as defined in claim 10, wherein the asynchronous system is fabricated on a single semiconductor substrate.

12. The asynchronous system as defined in claim 10, wherein in the at least one of the digital signal processing circuit modules:
the data processing circuit includes a transistor array having two multiple line data inputs and one multiple line data output,
the delay circuit includes a transistor block having one input and one output;
the transistor array of the data processing circuit has a first number of transistors in parallel with each line of the data inputs and a second number of transistors in parallel with each line of the data output, and
the delay circuit has the first number of transistors in parallel with the input of the delay circuit and the second number of transistors in parallel with the output of the delay circuit.

13. The asynchronous system as defined in claim 10, wherein the data processing circuit of the at least one of the digital signal processing circuit modules is one of an OHRNS adder, an OHRNS subtractor, and an OHRNS multiplier.

14. The asynchronous system as defined in claim 10,
wherein a first of the control units has an input coupled to the control output of a first of the digital signal processing circuit modules and an output coupled to the control input of a second of the digital signal processing circuit modules, and
a second of the control units has an input coupled to the control output of the second digital signal processing circuit module and an output coupled to the control input of a third of the digital signal processing circuit modules.

15. The asynchronous system as defined in claim 14, wherein the first control unit has another input coupled to the output of the second control unit.

16. A self-timed OHRNS processing circuit comprising:
a first processing module producing a data output and an Ack output, the Ack output being toggled when the data output of the first processing module is ready;
a second processing module coupled to the first processing module, the second processing module including a Req input, an Ack output, a transistor array, and a delay circuit, the Req input of the second processing module being coupled to the Ack output of the first processing module, the Ack output of the second processing module being toggled when the data output of the second processing module is ready, the transistor array having a uniform processing delay for producing the data output for all valid inputs, and the delay circuit delaying the Req input of the second processing module by a time period that is substantially equal to the uniform processing delay of the transistor array;
a third processing module coupled to the second processing module, the third processing module including a Req input that is coupled to the Ack output of the second processing module; and
a control unit coupled between the Ack output of the first processing module and the Req input of the second processing module, the control unit controlling the timing of the toggling of the Req input of the second processing module based at least partially on the Ack output of the first processing module.

17. The self-timed OHRNS processing circuit as defined in claim 16, wherein the first, second, and third processing modules are fabricated on a single semiconductor substrate.

18. The self-timed OHRNS processing circuit as defined in claim 16, wherein the output of the delay circuit of the second processing module has additional output loading so as to cause an additional delay.

19. The self-timed OHRNS processing circuit as defined in claim 16, wherein the first, second, and third processing modules are each one of an OHRNS adder, an OHRNS subtractor, and an OHRNS multiplier.

20. The self-timed OHRNS processing circuit as defined in claim 16, wherein the control unit has another input coupled to an output of a second control unit, the second control unit having an input coupled to an Ack output of the third processing module.

* * * * *